(12) United States Patent
Chen et al.

(10) Patent No.: US 9,407,231 B2
(45) Date of Patent: Aug. 2, 2016

(54) APPARATUS AND METHOD OF MULTI-SENSOR SOUND RECORDING

(71) Applicant: HTC Corporation, Taoyuan County (TW)

(72) Inventors: Lei Chen, Taoyuan County (TW);
Yu-Chieh Lai, Taoyuan County (TW);
Chun-Ren Hu, Taoyuan County (TW);
Chun-Min Lee, Taoyuan County (TW);
Chao-Hung Tai, Taoyuan County (TW);
Hann-Shi Tong, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 445 days.

(21) Appl. No.: 13/942,719

(22) Filed: Jul. 16, 2013

(65) Prior Publication Data

US 2014/0219475 A1 Aug. 7, 2014

Related U.S. Application Data

(60) Provisional application No. 61/761,274, filed on Feb. 6, 2013.

(51) Int. Cl.
*H03G 5/00* (2006.01)
*H03G 5/16* (2006.01)

(52) U.S. Cl.
CPC .................................... *H03G 5/165* (2013.01)

(58) Field of Classification Search
CPC ................ B81B 2201/0257; H04R 2201/003; H04R 2201/34; H04R 2201/40; H04R 2420/00; H04R 2420/01; H04R 3/04; H04R 1/28; H04R 1/406; H03G 5/165
USPC ........ 381/92, 74, 94.8, 94.7, 94.5, 94.3, 94.2, 381/111, 112, 113, 114, 115, 106, 107, 381/98–103, 312, 317, 316, 320, 321, 56, 381/57, 55, 28, 26, 119; 700/94
See application file for complete search history.

(56) References Cited

U.S. PATENT DOCUMENTS 4,741,035 A * 4/1988 Genuit .................. H04R 5/027
381/26
8,170,244 B2 5/2012 Ryan et al.
(Continued)

FOREIGN PATENT DOCUMENTS

CN 102742299 10/2012
JP 60080311 A * 5/1985 ............... H03G 3/34
WO 2012093598 7/2012

OTHER PUBLICATIONS

"Office Action of Taiwan Counterpart Application," issued on Sep. 25, 2015, p. 1-p. 4.

*Primary Examiner* — Leshui Zhang
(74) *Attorney, Agent, or Firm* — Jianq Chyun IP Office

(57) ABSTRACT

An apparatus and a method for sound recording are provided. The apparatus stores an equalizer and includes a housing, a microphone, and a processor. The microphone includes a plurality of sensors and receives a sound signal through an acoustical resonator in the housing. The microphone generates a plurality of electronic signals in response to the sound signal. The equalizer generates a plurality of equalized signals according to the electronic signals. The processor generates an output signal according to the equalized signals. The equalizer compensates the gain margin and the phase margin caused by the sound signal passing through the acoustical resonator in order to prevent the output signal from being affected by resonance of the sound signal in the acoustical resonator.

14 Claims, 7 Drawing Sheets

(56) References Cited

U.S. PATENT DOCUMENTS

| | | |
|---|---|---|
| 8,224,016 B2 | 7/2012 | Song |
| 8,233,637 B2 | 7/2012 | Phelps et al. |
| 2010/0117485 A1 | 5/2010 | Martin et al. |
| 2010/0158268 A1* | 6/2010 | Marton .................. H04N 7/142 381/92 |
| 2012/0250884 A1 | 10/2012 | Phelps et al. |
| 2012/0250900 A1* | 10/2012 | Sakai ....................... H04R 3/04 381/122 |

* cited by examiner

APPARATUS AND METHOD OF MULTI-SENSOR SOUND RECORDING

CROSS-REFERENCE TO RELATED APPLICATION

This application claims the priority benefit of U.S. provisional application Ser No. 61/761,274, filed on Feb. 06, 2013. The entirety of the above-mentioned patent application is hereby incorporated by reference herein and made a part of this specification.

BACKGROUND OF THE INVENTION

1. Field of the Invention

The invention relates to a sound recording apparatus and method, and particularly to a sound recording apparatus and method that use multiple sensors.

2. Description of Related Art

A function of sound recording is common to smart phones nowadays. However, current smart phones adopt single-membrane microphones. The design of a membrane in a single-membrane microphone may be aimed at high sensitivity or high volume, but cannot achieve both. Single-membrane microphones with high sensitivity produce less noise and demonstrate better recording quality. However, when they are used for high-volume sound recording, distortion may occur. Meanwhile, single-membrane microphones suitable for high-volume sound recording produce louder noise. Therefore, manufacturers have provided multi-membrane microphones which combine two types of membranes so as to satisfy both requirements of high sensitivity and high volume.

SUMMARY OF THE INVENTION

The invention provides a sound recording apparatus and method not only to satisfy both requirements of high sensitivity and high volume, but also to solve a problem of acoustic resonance in a sound recording operation.

The sound recording apparatus of the invention includes a housing, a microphone, a memory, and a processor. The housing has an acoustical resonator, and the acoustical resonator allows a sound signal to pass therethrough. The microphone is disposed in the housing and communicates with the acoustical resonator. The microphone includes a plurality of sensors. The sensors are configured to convert the sound signal into a plurality of electronic signals. The acoustical resonator causes the microphone to generate a frequency response offset. The memory stores an equalizer, and the equalizer compensates the frequency response offset. The processor is coupled to the microphone. The processor compensates the electronic signals according to the equalizer, and selects or combines the compensated electronic signals to generate an output signal.

The sound recording method of the invention is adapted to the above-mentioned sound recording apparatus. The sound recording method includes the following steps. A sound signal is converted into a plurality of electronic signals. The electronic signals are compensated according to the equalizer, wherein the frequency response offset is compensated by the equalizer. Moreover, the compensated electronic signals are selected or combined to generate an output signal.

To make the above features and advantages of the invention more comprehensible, embodiments accompanied with drawings are described in detail as follows.

BRIEF DESCRIPTION OF THE DRAWINGS

FIG. 3-1 is flow chart of a method for generating the electronic signal 165 in step 350.

DESCRIPTION OF EMBODIMENTS

Figure 1:
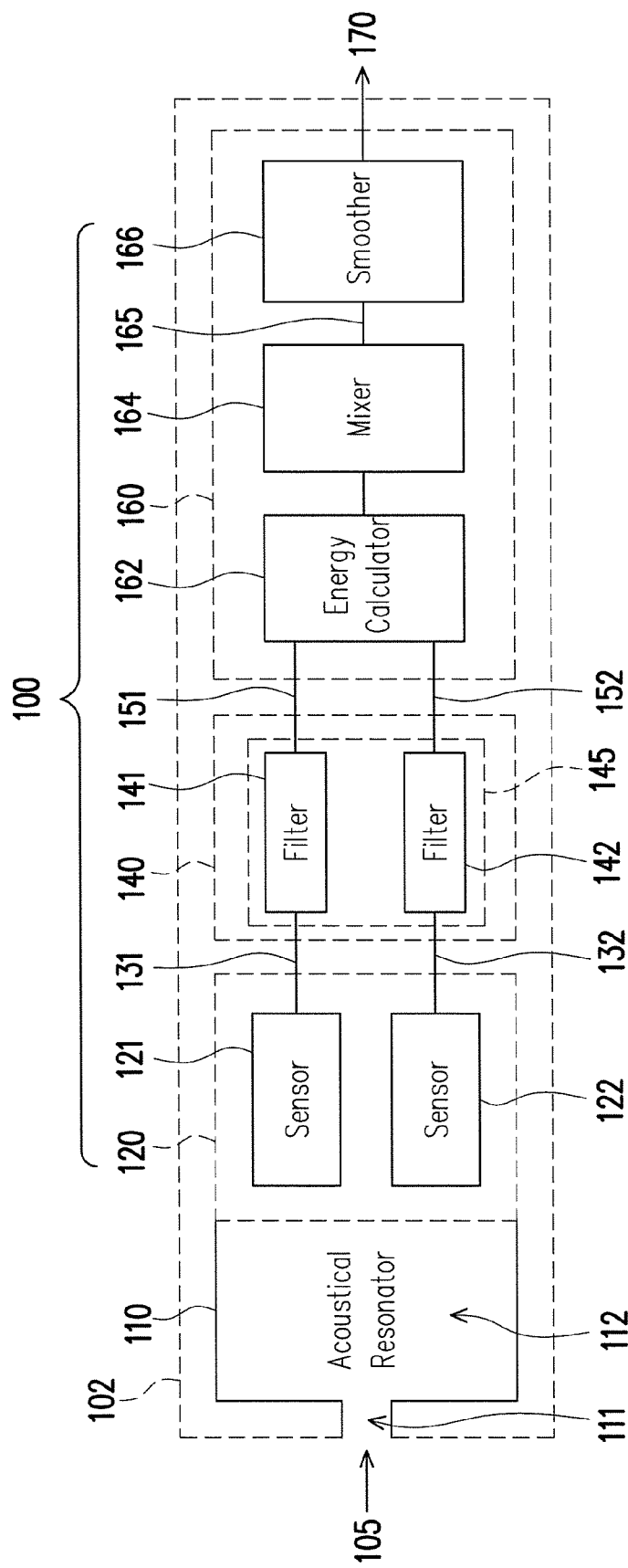
FIG. 1 is a schematic view of a sound recording apparatus according to an embodiment of the invention.

FIG. 1 is a schematic view of a sound recording apparatus 100 according to an embodiment of the invention. The sound recording apparatus 100 includes a housing 102, an acoustical resonator 110, a microphone 120, a memory 140, and a processor 160. The acoustical resonator 110 is disposed in the housing 102. The acoustical resonator 110 allows a sound signal 105 to pass therethrough. The microphone 120 is disposed in the housing 102 and communicates with the acoustical resonator 110. The microphone 120 includes two sensors 121 and 122. In the present embodiment, the sensor 121 is a high signal-to-noise ratio (HSNR) membrane having high sensitivity, and the sensor 122 is a high sound pressure level (HSPL) membrane suitable for high-volume sound recording. In addition to membranes, the sensors 121 and 122 may also be other types of sensors capable of converting the sound signal 105 into electronic signals. The memory 140 stores an equalizer 145. The equalizer 145 includes two filters 141 and 142. The processor 160 is coupled to the microphone 120. The processor 160 includes an energy calculator 162, a mixer 164, and a smoother 166.

The microphone 120 receives the sound signal 105 through the acoustical resonator 110. The acoustical resonator 110 includes a channel 111 and a front chamber 112. The sound recording apparatus 100 may be a part of an electronic apparatus such as a smart phone, a tablet PC, a notebook or a personal computer. The acoustical resonator 110 may be disposed in the housing 102 of the aforementioned electronic apparatus, and the acoustical resonator 110 may appear as a small hole on the housing 102.

The energy calculator 162 is coupled to the sensors 121 and 122. The mixer 164 is coupled to the energy calculator 162. The smoother 166 is coupled to the mixer 164. The sound signal 105 passes through the acoustical resonator 110, the microphone 120, the equalizer 145 and the processor 160, and then becomes an output signal 170 of the sound recording apparatus 100. The equalizer 145, the filters 141 and 142, the energy calculator 162, the mixer 164, and the smoother 166 may be hardware or software. If the equalizer 145 is hardware, the memory 140 is not required for storing the equalizer 145.

Figure 2A:
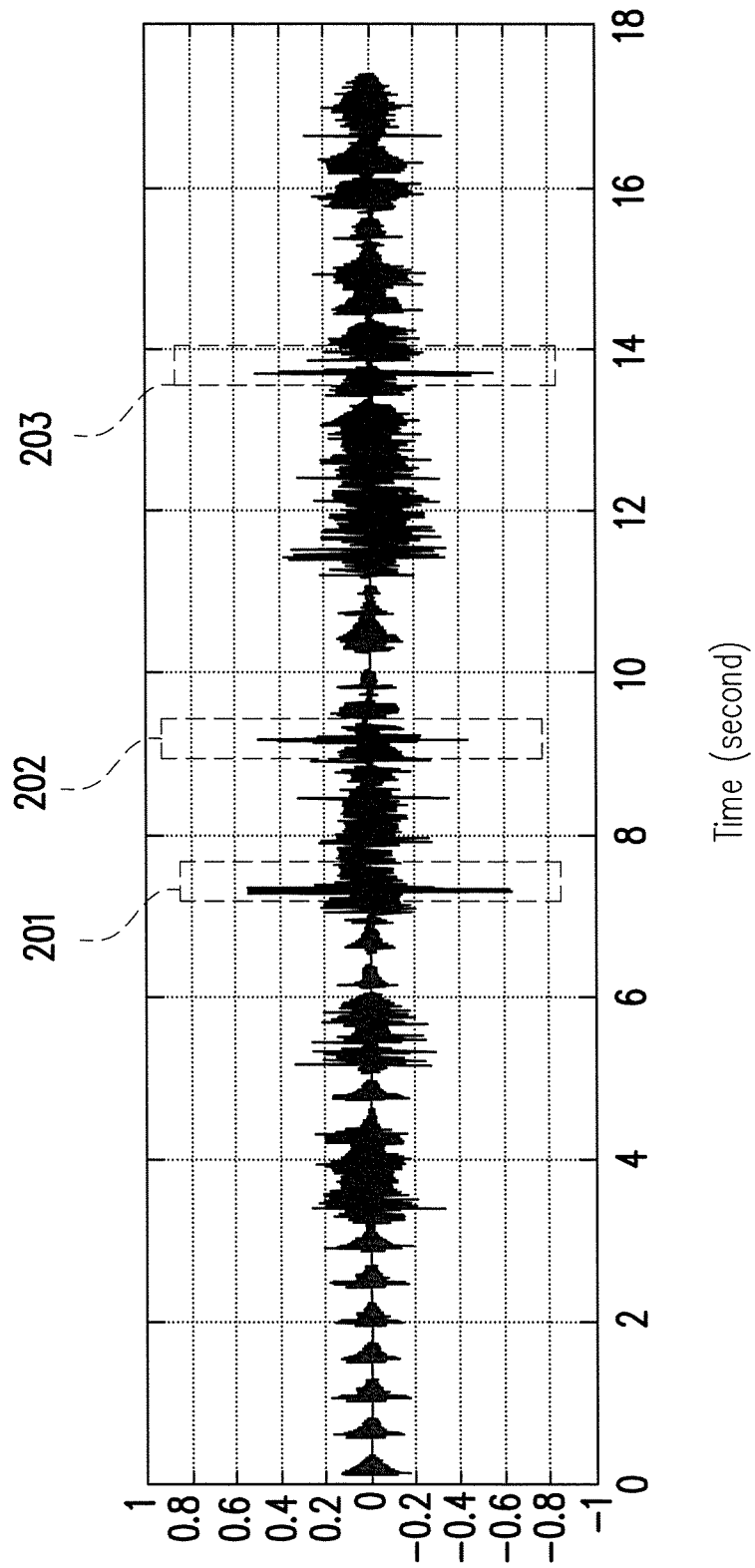
FIG. 2A is a schematic view of an output signal of a sound recording apparatus according to an embodiment of the invention.
Figure 2B:
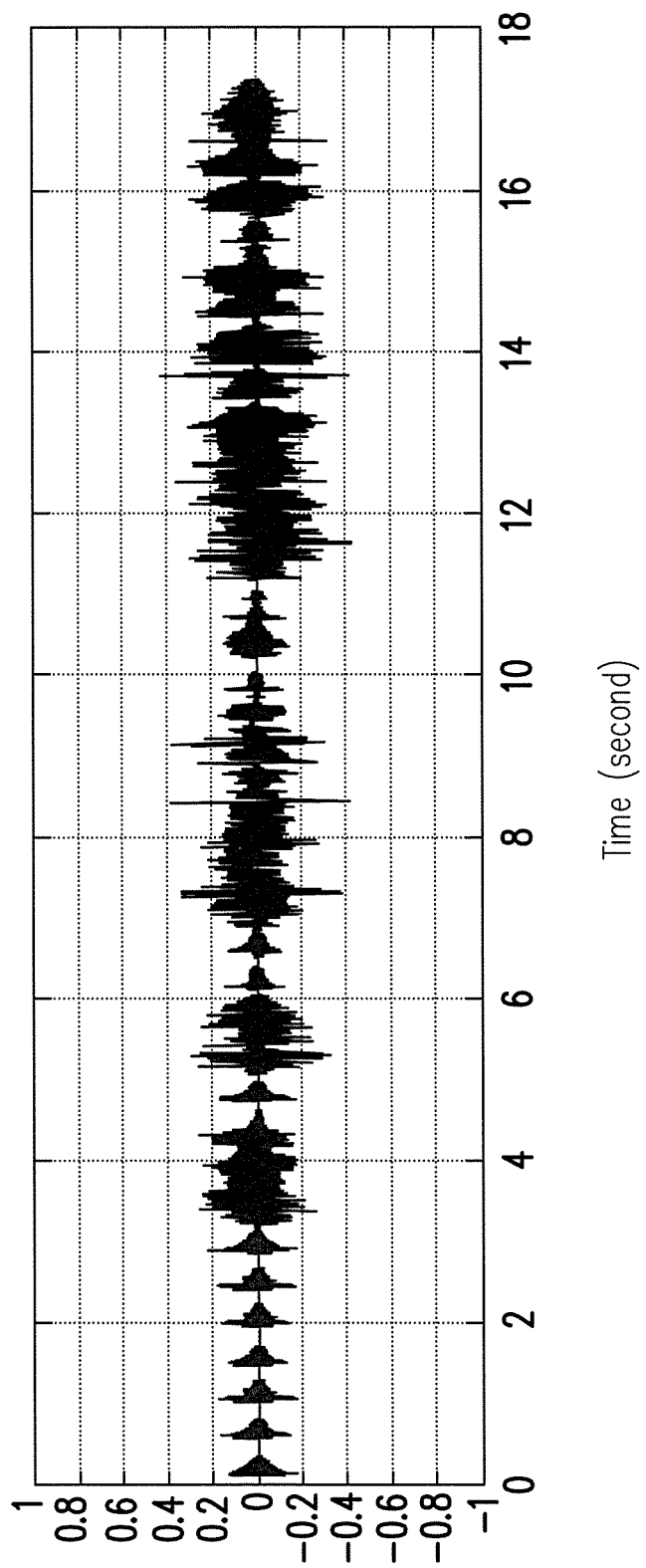
FIG. 2B is a schematic view of an output signal of a sound recording apparatus according to another embodiment of the invention.

When the sound signal 105 has a specific frequency, the sound signal 105 resonates with the acoustical resonator 110 so that the output signal 170 changes drastically in volume. Especially when the sound signal 105 has a high audio frequency or a high volume, such unstable and changing oscillation becomes more apparent, as shown in FIGS. 2A and 2B. FIG. 2A is a schematic view of the output signal 170 of the sound recording apparatus 100 according to an embodiment of the invention. Rectangular frames numbered 201, 202 and 203 indicate where there are unstable oscillations in the signal waveform. If there is no resonance of the acoustical resonator 110, there is no oscillation between high volume and low volume in the waveform of the output signal 170, as shown in FIG. 2B. In other words, the acoustical resonator 110 causes the microphone 120 to generate a frequency response offset, and the equalizer 145 compensates the frequency response offset.

Figure 3:
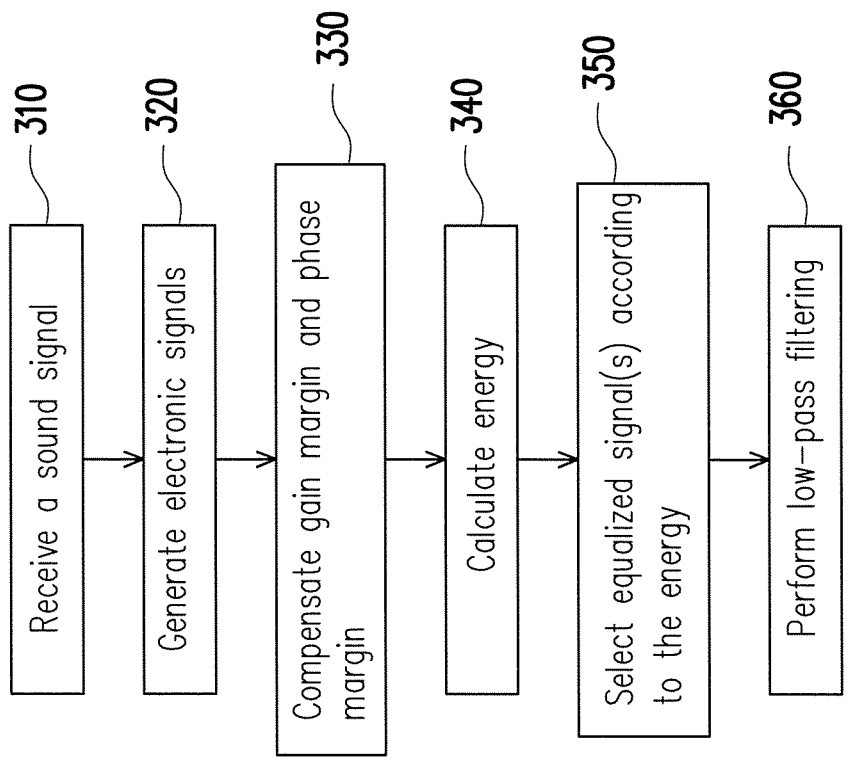
FIG. 3 is a flow chart of a sound recording method according to an embodiment of the invention.
Figures 1, 3:
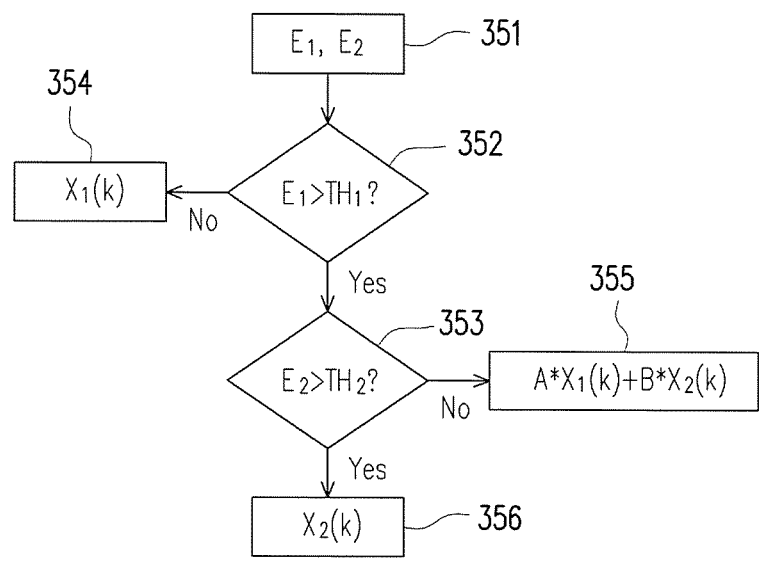

The sound recording apparatus 100 includes the equalizer 145 to eliminate the aforementioned unstable oscillation. An overall operation of the sound recording apparatus 100 is as shown in FIG. 3. FIG. 3 is a flow chart of a sound recording method according to an embodiment of the invention. The flow of the method in FIG. 3 may be executed by the sound recording apparatus 100.

In step 310, the microphone 120 receives the sound signal 105 through the acoustical resonator 110. In step 320, the sensors 121 and 122 generate electronic signals 131 and 132 respectively in response to the sound signal 105. In step 330, the filter 141 generates an equalized signal 151 according to the electronic signal 131, and the filter 142 generates an equalized signal 152 according to the electronic signal 132. In step 330, the filters 141 and 142 serve to compensate a gain margin and a phase margin caused by the sound signal 105 passing through the acoustical resonator 110, so as to prevent the output signal 170 from being affected by resonance of the sound signal 105 in the acoustical resonator 110, thereby further preventing the aforementioned unstable oscillation. The processor 160 compensates the electronic signals 131 and 132 according to the equalizer 145.

In step 340, the energy calculator 162 calculates energy $E_1$ of the equalized signal 151, and calculates energy $E_2$ of the equalized signal 152. The energy calculator 162 calculates $E_1$ and $E_2$ by performing a plurality of samplings of the equalized signals 151 and 152 separately according to a predetermined sampling period.

In step 350, the mixer 164 selects the equalized signal 151 and/or the equalized signal 152 according to $E_1$ and $E_2$ to generate an electronic signal 165, thus combining the two signals originating from the sensors 121 and 122 into a single signal. For instance, when $E_1$ is less than or equal to a predetermined first threshold value (e.g. 80 dB), the mixer 164 directly outputs the equalized signal 151 as the electronic signal 165. When $E_1$ is greater than the first threshold value and $E_2$ is less than or equal to a predetermined second threshold value (e.g. 120 dB), the mixer 164 outputs a linear combination of the equalized signals 151 and 152 as the electronic signal 165. The linear combination is generally expressed as follows: $A*X_1(k)+B*X_2(k)$, wherein A and B are predetermined parameters, and $X_1(k)$ and $X_2(k)$ are respectively current values of the equalized signals 151 and 152. When $E_1$ is greater than the first threshold value and $E_2$ is greater than the second threshold value, the mixer 164 directly outputs the equalized signal 152 as the electronic signal 165.

The method for generating the electronic signal 165 in step 350 could be illustrated as a flow chart in FIG. 3-1. Referring to FIG. 3-1, the mixer 164 first obtains the energy $E_1$ of the equalized signal 151 and the energy $E_2$ of the equalized signal 152 calculated by the energy calculator 162 (step 351). The mixer 164 compares the energy $E_1$ with the first threshold value $TH_1$ (step 352) and also compares the energy $E_2$ with the second threshold value $TH_2$ (step 353). When the energy $E_1$ is less than or equal to the predetermined first threshold value TH1, the mixer outputs the equalized signal 151 as the electronic signal 165 (i.e. $X_1(k)$) (step 354). When the energy $E_1$ is greater than the first threshold value $TH_1$ and when the energy $E_2$ is less than the second threshold value $TH_2$, given that $TH_2>TH_1$, the mixer outputs a linear combination of the equalized signal 151 and the second equalized signal 152 (i.e. $A*X_1(k)+B*X_2(k)$) (step 355). When the energy $E_1$ of the equalized signal 151 is greater than the first threshold value TH1 and when the energy $E_2$ of the equalized signal 152 is greater than the second threshold value $TH_2$, the mixer outputs the equalized signal 152 as the electronic signal 165 (i.e. $X_2(k)$) (step 356).

If there is no equalizer 145, the resonance of the sound signal 105 in the acoustical resonator 110 will have bad influence on the generation process of the output signal 170 within the mixer 164. The generation of the output signal 170 may be divided into three situations, namely, a situation where $E_1$ is less than or equal to the first threshold value, a situation where $E_1$ is greater than the first threshold value and $E_2$ is less than or equal to the second threshold value, and a situation where $E_1$ is greater than the first threshold value and $E_2$ is greater than the second threshold value. The aforementioned resonance causes the mixer 164 to switch frequently between the three situations, and may even cause wrong switches so that the output signal 170 changes drastically in volume.

In step 360, the smoother 166 performs a low-pass filtering to the electronic signal 165 to generate the output signal 170. The low-pass filtering performed by the smoother 166 eliminates discontinuous surges of the output signal 170, thus smoothing the output signal 170. For instance, the smoother 166 may output a linear combination expressed as $L*O(k-1)+(1-L)*Y(k)$ as the output signal 170, wherein L is a predetermined parameter greater than 0 but less than 1, $O(k)$ is a value of the output signal 170, $O(k-1)$ is a previous value of the output signal 170, and $Y(k)$ is a current value of the electronic signal 165.

Figure 4:
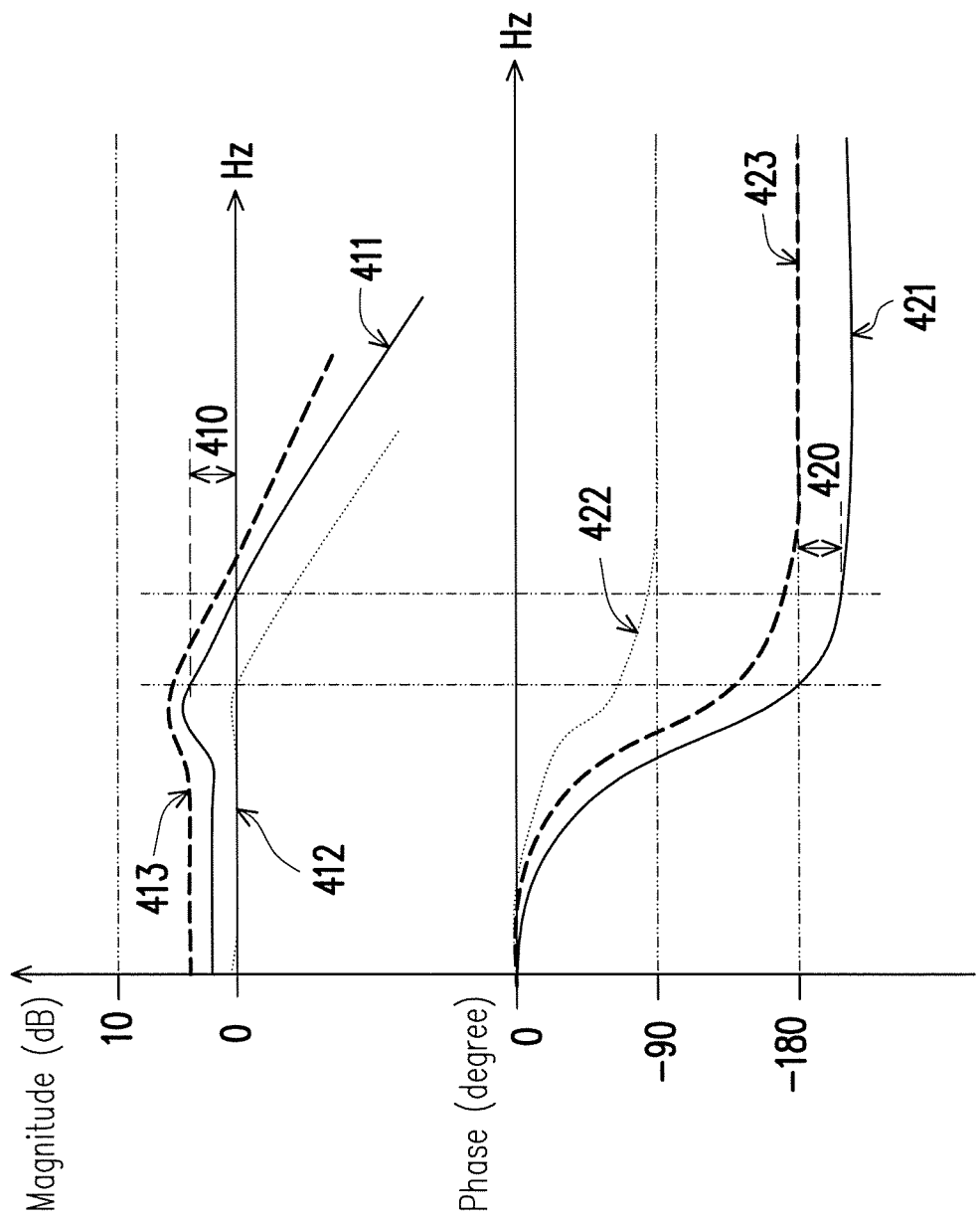
FIG. 4 is a Bode plot of a sound recording apparatus according to an embodiment of the invention.

FIG. 4 is a Bode plot of the sound recording apparatus 100 according to an embodiment of the invention. The sound recording apparatus 100 in the present embodiment does not include the equalizer 145. 411 to 413 respectively represent frequency responses of the magnitudes of the transfer functions of the acoustical resonator 110 with the entire sound recording apparatus 100, the smoother 166, and the acoustical resonator 110 alone. 421 to 423 respectively represent frequency responses of the phases of the transfer functions of the acoustical resonator 110 with the entire sound recording apparatus 100, the smoother 166, and the acoustical resonator 110 alone.

Since the smoother 166 is a low-pass filter, the gain margin and phase margin are very important to stability of the entire sound recording system. However, a gain margin 410 and a phase margin 420 as illustrated in FIG. 4 are smaller, resulting in instability of the sound recording apparatus 100. When the sound signal 105 generates resonance in the acoustical resonator 110, unstable oscillations occur in the output signal 170.

Figure 5:
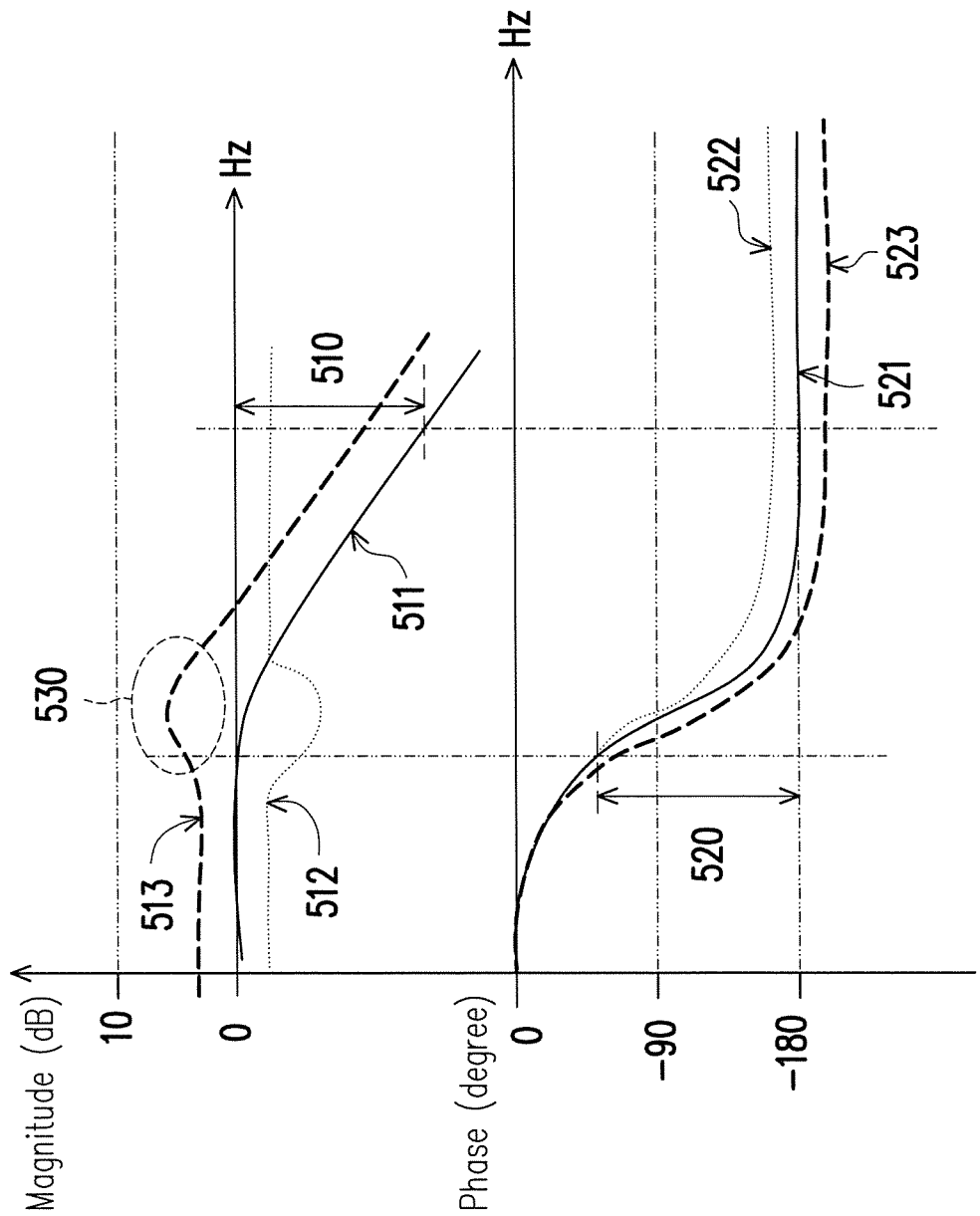
FIG. 5 is a Bode plot of a sound recording apparatus according to another embodiment of the invention.

FIG. 5 is a Bode plot of the sound recording apparatus 100 according to another embodiment of the invention. 511 to 513 respectively represent frequency responses of the magnitudes of the transfer functions of the acoustical resonator 110 with the sound recording apparatus 100 including the equalizer 145, the equalizer 145 alone, and the acoustical resonator 110 with the sound recording apparatus 100 excluding the equalizer 145. 521 to 523 respectively represent frequency responses of the phases of the transfer functions of the acoustical resonator 110 with the sound recording apparatus 100 including the equalizer 145, the equalizer 145 alone, and the acoustical resonator 110 with the sound recording apparatus 100 excluding the equalizer 145.

In a frequency band range numbered 530, a frequency response 511 of an output gain of the sensors 121 and 122 has a peak, and a frequency response 512 of the equalizer 145 has a negative peak. Thus, the equalizer 145 may compensate the gain margin by canceling out the peak of the sensors 121 and 122. In addition, the equalizer 145 may also compensate the phase margin by increasing an output phase of the sensors 121 and 122 to be greater than minus 180 degrees. The compensated gain margin and phase margin are respectively shown by 510 and 520. The gain margin 510 and the phase margin 520 are apparently greater than the gain margin 410 and the phase margin 420. This considerably enhances the stability of the sound recording system, thus preventing the output signal 170 from being affected by the resonance of the sound signal 105 in the acoustical resonator 110.

The equalizer 145 achieves a compensation effect by means of the filters 141 and 142. The filters 141 and 142 for compensating the gain margin and phase margin may be designed according to a Bode plot simply using conventional methods, and thus details thereof will be omitted herein. The filters 141 and 142 may be infinite impulse response filters or other types of filters having the same effect of compensation.

In summary, the invention combines the signals originating from two different sensors into a single signal, thereby achieving high quality sound recording with high sensitivity and low noise. Also, it is suitable for high-volume sound recording. In addition, the equalizer of the invention enhances stability of a sound recording system, preventing unstable oscillations from occurring in an output signal due to resonance of an acoustical resonator.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A sound recording apparatus comprising:
   a housing having an acoustical resonator, the acoustical resonator allowing a sound signal to pass therethrough;
   a microphone disposed in the housing and connected with the acoustical resonator, the microphone comprising a plurality of sensors configured to convert the sound signal into a plurality of electronic signals, wherein the acoustical resonator causes the microphone to generate a frequency response offset, wherein the sensors comprise a first sensor and a second sensor, and wherein the electronic signals comprise a first electronic signal and a second electronic signal;
   a memory storing an equalizer, the equalizer compensating the frequency response offset, wherein the equalizer comprises a first filter generating a first equalized signal according to the first electronic signal and a second filter generating a second equalized signal according to the second electronic signal; and
   a processor coupled to the microphone, the processor compensating the electronic signals according to the equalizer to generate compensated electronic signals comprising the first equalized signal and the second equalized signal, and generating an output signal according to the compensated electronic signals,
   wherein the processor comprises an energy calculator, a mixer coupled to the energy calculator, and a smoother coupled to the mixer,
   wherein the energy calculator calculates an energy of the first equalized signal and an energy of the second equalized signal separately,
   wherein the mixer selects one of the first equalized signal, the second equalized signal, and a linear combination of the first equalized signal and the second equalized signal as a third electronic signal according to the energies of the first equalized signal and the second equalized signal, and
   wherein the smoother performs a low-pass filtering to the third electronic signal to generate the output signal.

2. The sound recording apparatus of claim 1, wherein the equalizer compensates a gain margin and a phase margin caused by the sound signal passing through the acoustical resonator in order to prevent the output signal from being affected by resonance of the sound signal in the acoustical resonator.

3. The sound recording apparatus of claim 2, wherein the equalizer compensates the gain margin by canceling out an output gain of the sensors in a frequency band, and compensates the phase margin by increasing an output phase of the sensors to be greater than minus 180 degrees.

4. The sound recording apparatus of claim 3, wherein
   the first filter and the second filter are both infinite impulse response filters.

5. The sound recording apparatus of claim 1, wherein the energy calculator calculates the energy of the first equalized signal by performing a plurality of samplings of the first equalized signal according to a sampling period, and calculates the energy of the second equalized signal by performing a plurality of samplings of the second equalized signal according to the sampling period.

6. The sound recording apparatus of claim 1, wherein:
   when the energy of the first equalized signal is less than or equal to a first threshold value, the mixer outputs the first equalized signal as the third electronic signal;
   when the energy of the first equalized signal is greater than the first threshold value and when the energy of the second equalized signal is less than a second threshold value, the mixer outputs the linear combination of the first equalized signal and the second equalized signal as the third electronic signal, wherein the second threshold value is greater than the first threshold value; and
   when the energy of the first equalized signal is greater than the first threshold value and when the energy of the second equalized signal is greater than the second threshold value, the mixer outputs the second equalized signal as the third electronic signal.

7. The sound recording apparatus of claim 1, wherein the smoother outputs a linear combination of a previous output signal and the third electronic signal as the output signal.

8. A sound recording method adapted to a sound recording apparatus, the sound recording apparatus comprising a housing, the housing having an acoustical resonator, the acoustical resonator allowing a sound signal to pass therethrough and generate a frequency response offset, the sound recording method comprising:
   converting the sound signal into a plurality of electronic signals respectively by a plurality of sensors, wherein the electronic signals comprise a first electronic signal and a second electronic signal;
   compensating the electronic signals according to an equalizer to generate compensated electronic signals comprising a first equalized signal and a second equalized signal, wherein the equalizer compensates the frequency response offset and comprises a first filter generating the first equalized signal according to the first electronic signal and a second filter generating the second equalized signal according to the second electronic signal; and generating an output signal according to the compensated electronic signals comprising:
  calculating an energy of the first equalized signal and an energy of the second equalized signal separately;
  selecting one of the first equalized signal, the second equalized signal, and a linear combination of the first equalized signal and the second equalized signal as a third electronic signal according to the energies of the first equalized signal and the second equalized signal; and
  performing a low-pass filtering to the third electronic signal to generate the output signal.

9. The sound recording method of claim 8, wherein the equalizer compensates a gain margin and a phase margin caused by the sound signal passing through the acoustical resonator in order to prevent the output signal from being affected by resonance of the sound signal in the acoustical resonator.

10. The sound recording method of claim 9, wherein the step of compensating the electronic signals comprises:
  compensating the gain margin by canceling out an output gain of the sensors in a frequency band; and
  compensating the phase margin by increasing an output phase of the sensors to be greater than minus 180 degrees.

11. The sound recording method of claim 10, wherein the first filter and the second filter are both infinite impulse response filters.

12. The sound recording method of claim 8, wherein the step of calculating the energy of the first equalized signal and the energy of the second equalized signal separately comprises:
  calculating the energy of the first equalized signal by performing a plurality of samplings of the first equalized signal according to a sampling period; and
  calculating the energy of the second equalized signal by performing a plurality of samplings of the second equalized signal according to the sampling period.

13. The sound recording method of claim 8, wherein the step of selecting one of the first equalized signal, the second equalized signal, and the linear combination of the first equalized signal and the second equalized signal as the third electronic signal according to the energy of the first equalized signal and the second equalized signal comprises:
  when the energy of the first equalized signal is less than or equal to a first threshold value, outputting the first equalized signal as the third electronic signal;
  when the energy of the first equalized signal is greater than the first threshold value and when the energy of the second equalized signal is less than a second threshold value, outputting the linear combination of the first equalized signal and the second equalized signal as the third electronic signal, wherein the second threshold value is greater than the first threshold value; and
  when the energy of the first equalized signal is greater than the first threshold value and when the energy of the second equalized signal is greater than the second threshold value, the outputting the second equalized signal as the third electronic signal.

14. The sound recording method of claim 8, wherein the step of performing the low-pass filtering to the third electronic signal to generate the output signal comprises:
  outputting a linear combination of a previous output signal and the third electronic signal as the output signal.

* * * * *